United States Patent [19]

Falster

[11] Patent Number: 5,272,119
[45] Date of Patent: Dec. 21, 1993

[54] PROCESS FOR CONTAMINATION REMOVAL AND MINORITY CARRIER LIFETIME IMPROVEMENT IN SILICON

[75] Inventor: Robert Falster, Milan, Italy

[73] Assignee: MEMC Electronic Materials, SpA, Novara, Italy

[21] Appl. No.: 971,056

[22] Filed: Nov. 3, 1992

[51] Int. Cl.$^5$ .................................. H01L 21/324
[52] U.S. Cl. ................................ 437/247; 437/12; 437/939; 148/DIG. 24
[58] Field of Search ............... 437/10, 11, 12, 14, 437/247, 939, 946; 148/DIG. 17, DIG. 23, DIG. 24, DIG. 60, DIG. 127

[56] References Cited

U.S. PATENT DOCUMENTS

| | | | |
|---|---|---|---|
| 3,929,529 | 12/1975 | Poponiak | 148/DIG. 24 |
| 4,053,335 | 10/1977 | Hu | 437/12 |
| 4,231,809 | 11/1980 | Schmidt | 148/DIG. 24 |
| 4,314,595 | 2/1982 | Yamamoto et al. | 148/DIG. 24 |
| 4,637,123 | 1/1987 | Cazcarra et al. | 148/DIG. 24 |
| 4,732,874 | 3/1988 | Sparks | 437/247 |
| 4,929,564 | 5/1990 | Kainosho et al. | 437/247 |
| 4,994,399 | 2/1991 | Aoki | 437/11 |

FOREIGN PATENT DOCUMENTS 0136531  6/1988  Japan ................................ 437/12

OTHER PUBLICATIONS

Adegboyega et al., "The effects of High Temperature Anneal on the Electrical Activity of Iron in B-Doped CZ Silicon", Phys. Stat. Sol. vol. 114, pp. 247-252, 1989.
CA, 114: 133724h, Gilles et al., 1990.
CA, 112: 189277r, Pivac et al., 1990.
CA, 112: 243942u, Gilles et al., 1990.
CA, 112: 149279m, Gilles et al., 1990.
CA, 112: 28840d, Kissinger et al., 1989.
CA, 111: 222806s, Adegboyegn et al., 1989.
CA, 104: 43404t, Niese et al., 1984.
Gao et al., Annealing and Profile of Interstitial Iron in Boron-doped Silicon, Appl. Phys. Lett. 59(17), Oct. 21, 1991, pp. 2133-2135.
Zoth et al., A Fast, Preparation-Free Method to Detect Iron in Silicon, J. Appl. Phys. 67(11), Jun. 1, 1990, pp. 6764-6771.
Weber, Transition Metals in Silicon, Appl. Phys. A-30, (1983) p. 1-22.
Shimura, Semiconductor Silicon Crystal Technology, Academic Press, Inc., pp. 183-197, 405-406.

Primary Examiner—Brian E. Hearn
Assistant Examiner—C. Chaudhari
Attorney, Agent, or Firm—Senniger, Powers, Leavitt & Roedel

[57] ABSTRACT

A process for increasing the minority carrier recombination lifetime in a silicon body contaminated with transition metals, expecially iron. The silicon body is stored at a temperature and for a period sufficient to cause metal to diffuse from the bulk of the silicon body to the surface of the silicon body to measurably increase the minority carrier recombination lifetime.

22 Claims, 2 Drawing Sheets

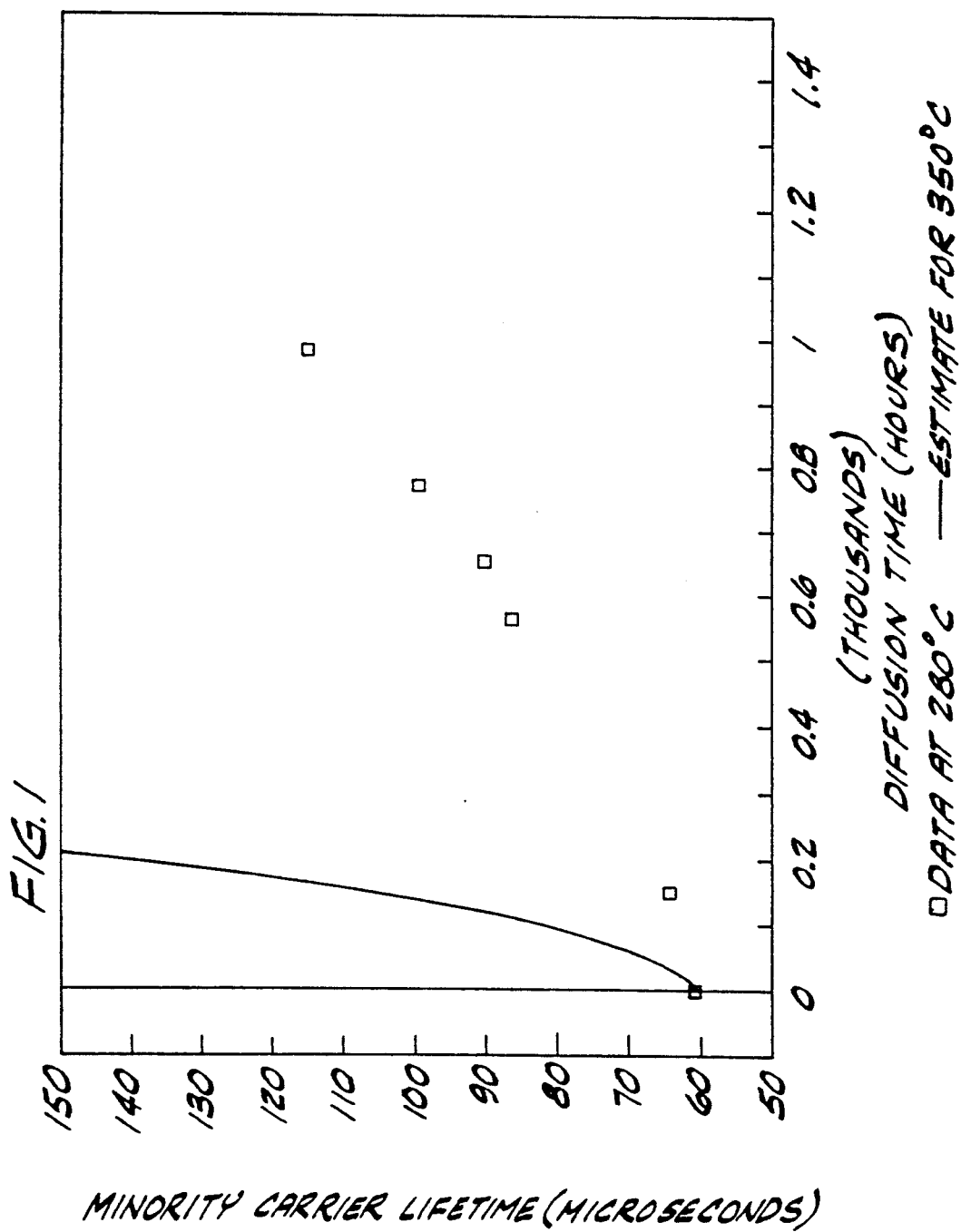

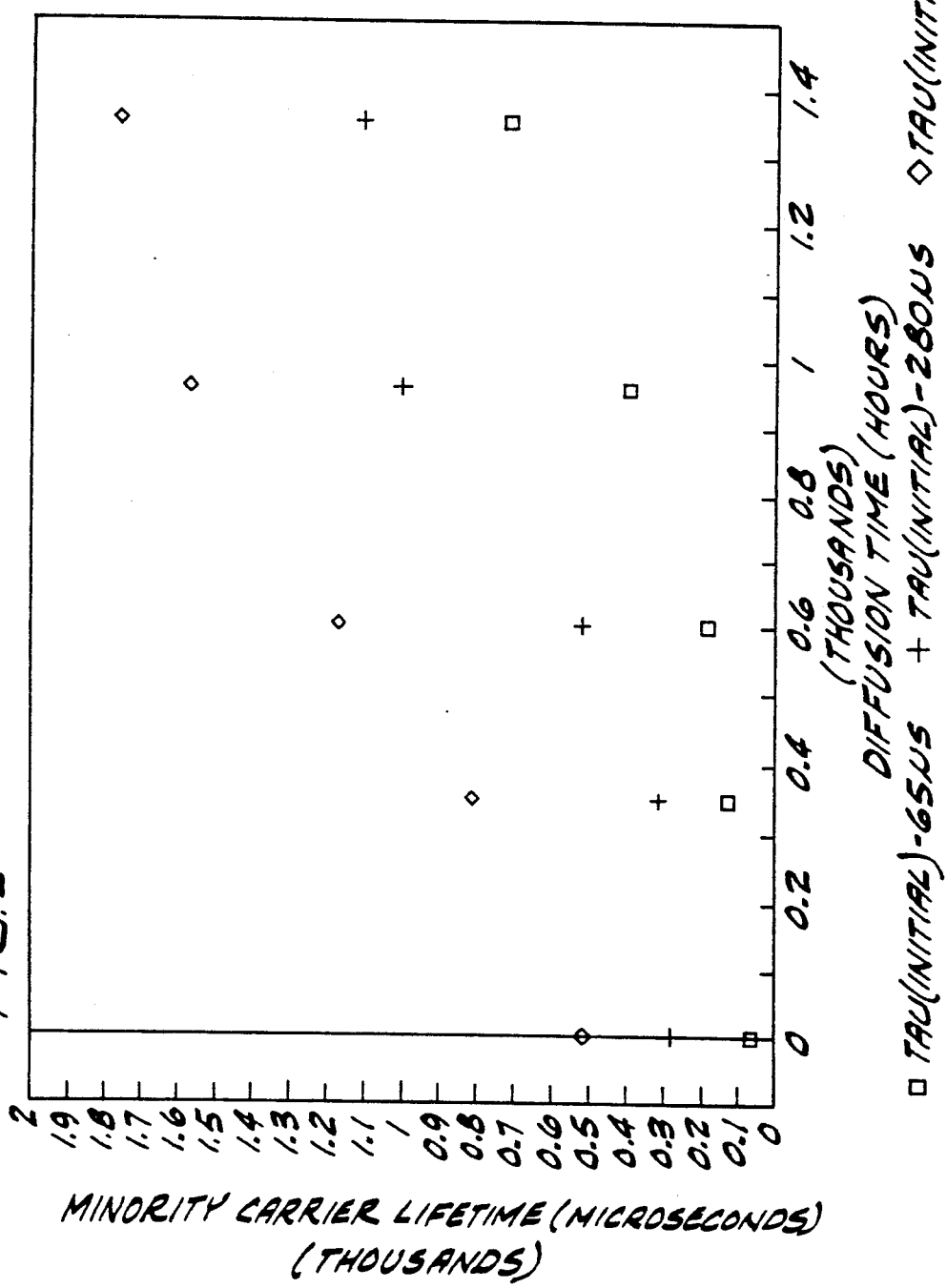

PROCESS FOR CONTAMINATION REMOVAL AND MINORITY CARRIER LIFETIME IMPROVEMENT IN SILICON

BACKGROUND OF THE INVENTION

This invention relates to silicon and silicon wafers used in the manufacture of semiconductor devices and to a process for improving the minority carrier recombination lifetime in silicon by reducing iron contamination.

The minority carrier recombination lifetime and minority carrier diffusion length of a silicon body are related and are, therefore, sometimes referred to interchangeably. In p-type silicon, minority carrier diffusion length and minority carrier recombination lifetime are related according to the following expression: $L_d = ((D_n)(t_n))^{0.5}$ wherein $L_d$ is the minority carrier diffusion length in centimeters, $D_n$ is the electron diffusion coefficient, taken to be 35 cm$^2$/sec, and $t_n$ is minority carrier recombination lifetime in seconds. In n-type silicon, minority carrier diffusion length and minority carrier recombination lifetime are related according to the following expression: $L_d = ((D_p)(t_p))^{0.5}$ wherein $L_d$ is the minority carrier diffusion length in centimeters, $D_p$ is the hole diffusion coefficient, taken to be 12.5 cm$^2$/sec, and $t_p$ is minority carrier recombination lifetime in seconds.

Various techniques may be used to measure the minority carrier recombination lifetime (or minority carrier diffusion length) of a silicon wafer and typically involve injecting carriers into a wafer sample by means of a flash of light or voltage pulses and observing their decay. One process for measuring minority carrier recombination lifetime is the surface photovoltage (SPV) technique described in Zoth and Bergholz, *J. Appl. Phys.*, 67, 6764 (1990). Alternatively, diffusion length may be measured using an ELYMAT instrument manufactured by GeMeTec (Munich, Germany) which measures to a resolution of about 1 mm the photocurrents generated by a scanning laser beam and collected by a dilute HF electrolytic function. Minority carrier diffusion lengths are calculated from these data and diffusion length images can be generated. See, e.g., H. Foell et al., Proc. ESSDERC Conference, Berlin 1989, p. 44. The calculated diffusion length values are readily converted to minority carrier recombination lifetime values using the formulas above.

As integrated circuit technology advances and the size of electrical devices continues to decrease, the need to impose tighter limits on metallic contamination continues to increase. Metallic contamination in silicon such as a silicon wafer causes a reduction of the minority carrier recombination lifetime and results in spurious electrical current leakage in electrical devices incorporating the silicon. Spurious electrical current leakage paths occur at metallically contaminated point defect sites in the vicinity of electrical junctions within the device or sub-device cell structure, or through leakage paths in the oxides used as field effect gates of isolation structures. Both paths are deleteriously increased in size when the silicon is contaminated with metals such as iron, copper, nickel, chromium, and titanium.

Gettering techniques have been used in an effort to reduce or eliminate metallic contamination in silicon wafers. Such techniques involve the introduction of defect sites into silicon wafers at locations which do not disturb the functioning of electronic devices fabricated in the wafer. For example, defects have been introduced to the backsurface of the wafer (external gettering) and by allowing oxygen to precipitate in the bulk of the wafer but not near the surface (internal gettering).

Although gettering techniques have been useful in preventing fast diffusing metals such as copper and nickel from actively participating in recombination processes in those areas containing electronic devices, such techniques have not been particularly effective for metals such as iron, chromium and titanium, which are relatively slow diffusing as compared to copper and nickel. Additionally, the defects introduced into silicon as gettering sinks can themselves reduce the quality of silicon, for example, by reducing minority carrier recombination lifetime. As a practical matter, therefore, industry has to date had little choice but to identify and eliminate to the extent possible sources of iron, chromium and titanium, particularly iron, contamination. Such an approach, however, is becoming increasingly costly as it becomes necessary to achieve ever decreasing levels of iron contamination; the manufacture of silicon wafers and devices having silicon components includes many steps and potential sources of contamination which must each be carefully examined and controlled.

SUMMARY OF THE INVENTION

Among the several objects of the invention may be noted the provision of a process for improving the quality of silicon; the provision of a process for reducing the concentration of iron in the bulk of silicon bodies, in general, and silicon wafers, in particular; the provision of such a process which does not unduly increase the cost or complication of the silicon wafer manufacturing process; the provision of such a process which does not introduce defects into silicon wafers; and the provision of such a process which results in significant increase in the minority carrier recombination lifetime of silicon wafers.

Briefly, therefore, the present invention is directed to a process for increasing the minority carrier recombination lifetime in a silicon body contaminated with a metal selected from the group consisting of iron, chromium, cobalt, manganese, zinc and vanadium. The silicon body is stored at a temperature and for a period sufficient to cause a sufficient amount of iron to diffuse from the bulk of the silicon body to the surface of the silicon body to measurably increase the minority carrier recombination lifetime of the silicon body. The storage period is at least about 48 hours.

BRIEF DESCRIPTION OF THE DRAWINGS

FIG. 1 is a plot of data for 625 micron thick, 150 mm diameter, CZ silicon wafers stored at 280° C. for varying lengths of time in accordance with this invention. On the vertical axis are the wafers' minority carrier recombination lifetimes in microseconds; on the horizontal axis are the storage periods in hours.

FIG. 2 is a plot of data for 1400 micron thick, 150 mm diameter, MCZ silicon wafers stored at 400° C. for varying lengths of time in accordance with this invention. On the vertical axis are the wafers' minority carrier recombination lifetimes in microseconds; on the horizontal axis are the storage periods in hours.

DETAILED DESCRIPTION OF THE INVENTION

As used herein in connection with a body of silicon such as a silicon wafer, the terms minority carrier recombination lifetime and minority carrier diffusion length shall mean the average minority carrier recombination lifetime and average minority carrier diffusion length for the entire body.

It has been discovered that the minority carrier recombination lifetime of silicon wafers can be increased by decreasing the average concentration of iron using the process of the present invention. Silicon wafers sliced from single crystal silicon grown by conventional Czochralski ("CZ") crystal growing techniques and prepared by conventional wafer shaping processes typically have an average minority carrier recombination lifetime of less than about 200 microseconds and an average iron content in the range of about $10^{10}$ to $10^{11}$ atoms/cm$^3$. Using the process of the present invention, iron concentrations less than $10^{10}$ atoms/cm$^3$ and preferably less than about $5 \times 10^9$ atoms/cm$^3$ can be achieved with a corresponding measurable increase in the minority carrier recombination lifetime.

The process of the present invention can be used to increase the minority carrier recombination lifetime of a body of silicon regardless of the manner in which that body was prepared and independently of the body's lifetime prior to processing in this manner, provided the lifetime is limited at least in part by iron contamination. The minority carrier recombination lifetime can be increased by such measurable amounts as 100, 200, or several hundred microseconds and more, thereby resulting in a 25%, 50%, 100% or greater improvement in minority carrier recombination lifetime. Accordingly, the minority carrier recombination lifetime of wafers having lifetime of about 200 microseconds may be increased to several hundred microseconds, at least about 500 microseconds, or even a millisecond or longer.

In accordance with this process, a silicon body such as a silicon wafer is stored for an extended period of time at an elevated temperature. Selection of an elevated temperature and length of storage for a given silicon body requires balancing several considerations. Because the diffusivity of iron increases with increasing temperature, a storage temperature should be selected at which the diffusion coefficient of iron is sufficiently great to permit substantial amounts of iron to diffuse from the bulk to the surface of the wafer in a commercially practical storage period. Accordingly, the storage temperature is at least about 200° C., preferably at least about 225° C., more preferably at least about 250° C., still more preferably at least about 300° C. and most preferably at least about 350° C.

The solubility of iron in silicon, however, also increases with increasing temperature. Specific values for solubility are in some doubt, but some generally accepted data have been provided by Weber, *Appl. Phys.*, A30, 1 (1983). It is desirable to keep the storage temperature sufficiently low in order to reduce the amount of iron which would be soluble in solid solution at equilibrium. In general, therefore, it is preferred that the storage temperature not exceed about 550° C., more preferably not exceed about 500° C., still more preferably not exceed about 390° C., and most preferably not exceed about 350° C.

The particular storage temperature selected is also affected by the oxygen content and manner of preparation of the silicon. Single crystal silicon grown by standard Czochralski ("CZ") techniques or by the CZ technique in the presence of a cusped magnetic field typically has an oxygen content between about 14 and about 20 parts per million atomic ("ppma") as determined by ASTM Standard F121-83. Significantly, in silicon containing more than about 10 ppma of oxygen undesirable types of oxygen-related defects sometimes referred to as "thermal donors" are formed in the temperature range between about 400° C. and 500° C. Thus, wafers having an oxygen content greater than about 10 ppma are preferably stored at a temperature less than about 400° C., more preferably at a temperature less than 390° C., still more preferably at a temperature less than 380° C., and most preferably at a temperature of about 350° C. In contrast to conventional CZ silicon, single crystal silicon grown by the float zone technique, by variations of the CZ technique in the presence of an axial or transverse magnetic field, or by other techniques being developed, may have an oxygen content below about 10 ppma. Such low oxygen silicon may tolerate storage temperatures between about 400° C. and about 500° C. without significant risk of producing oxygen-related defects.

The length of the storage period should be sufficient for the diffusion of significant amounts of iron from the bulk of the silicon to its surface. Where the silicon body is a wafer, for instance, the wafer bulk is of concern because improvements in minority carrier recombination lifetime are achieved by reducing iron concentration not just at the surface of the silicon, but by reducing iron concentration deep within the bulk of, and even entirely throughout, the silicon wafer. The bulk of the wafer is also of concern because unless iron content is reduced in regions within the wafer significantly beneath its surface, iron may remain in regions of the wafer where it is available to diffuse toward the device region of the wafer upon exposure to increased temperatures during subsequent device manufacturing operations.

To improve minority carrier recombination lifetime in a silicon wafer and to reduce the risk of diffusion of iron from the central regions of the wafer to critical regions during subsequent operations, therefore, iron from regions of the wafer bulk at distances from the wafer surface greater than 10% of the wafer thickness is caused to diffuse to the wafer surface. For example, to improve minority carrier recombination lifetimes in a silicon wafer having a thickness of at least 100 microns, iron, from regions of the wafer bulk at distances more than 10 microns from the front and back side of the wafer, is caused to diffuse to the surface. Preferably, iron from regions of the wafer bulk at distances from the wafer surface greater than 20% of the wafer thickness, more preferably from regions at distances from the wafer surface greater than 30% of the wafer thickness, and most preferably from the entire thickness of the wafer, is caused to diffuse to the surface. The required length of storage period to achieve such diffusion depends on numerous factors, including the thickness of the wafer, the storage temperature, and the amount of iron to be removed from the wafer. In general, storage periods which have been found to be sufficient are at least about 2 days, preferably at least about 4 days, more preferably at least about 7 days, and most preferably at least about 10 days.

Optimally, the storage period is incorporated in the sequence of conventional silicon processing operations which are known to those in the art. Descriptions of the these operations may be found in, for example, F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference), and may include crystal growing, wafer slicing, shaping, thermal donor annealing, etching and polishing. It is preferred that this storage period occur prior to final polishing, but after operations, such as thermal donor annealing, during which there is a significant potential for further iron contamination. Due to the position of this storage period within the wafer manufacturing sequence, and due to its effectiveness in reducing metal contamination, the need for the suppression of contamination sources in operations preceding the storage period is markedly reduced. Much of the complication and expense of making silicon wafer manufacturing and handling operations ultra-clean can therefore be avoided. Furthermore, the introduction of metal contamination into wafers can be tolerated, though it is still preferably avoided, to a significantly greater extent than in the absence of this process because such contamination is subsequently removable as described herein.

At the conclusion of the storage period, iron which has diffused from the bulk of the wafer to the wafer surface may be removed by techniques which may include cleaning, polishing, etching or combinations thereof. Such operations are well known in the art and are described, for example, in F. Shimura, *Semiconductor Silicon Crystal Technology*, Academic Press, (Chapter 5.5), 1989 (incorporated herein by reference). Cleaning may be accomplished by the widely used RCA cleaning treatment method as described in detail, for example, in Chapter 5.5 and Appendix XII of Shimura. Polishing is conventionally accomplished by chemomechanical processes in which the surface to be polished is brought into contact with an absorbent pad onto which is flowed an abrasive slurry. Etching solutions are also well known in the art, including those containing combinations of hydrofluoric, nitric and acetic acid. The surface layer containing the diffused iron to be removed by one or more of these techniques is generally on the order of a few microns or less in thickness.

The following examples further illustrate the operation of the invention.

EXAMPLE 1

A silicon wafer was sliced from a single crystal silicon ingot prepared by the Czochralski crystal growing technique. The wafer's thickness and diameter were 625 microns and 150 millimeters, respectively. The average minority carrier recombination lifetime of the wafer was determined by ELYMAT measurement to be about 61 microseconds. The average iron content of the wafer was estimated to be $2.9 \times 10^{11}$ cm$^{-3}$. The wafer was then placed in a quartz boat and stored in a Gallenkamp 300 plus series oven at a temperature of 280° C. for 980 hours in air. The wafer was allowed to cool and determined by ELYMAT measurement to have an average minority carrier recombination lifetime of about 115 microseconds. The average iron content was estimated to be about $1.6 \times 10^{11}$ cm$^{-3}$. The minority carrier recombination lifetimes of 61 and 115 microseconds before and after storage, respectively, are plotted in FIG. 1. Also plotted in FIG. 1 are minority carrier recombination lifetime values for similar wafers stored for periods between 0 and 980 hours. The solid line plotted in FIG. 1 is an estimate of the increase in minority carrier recombination lifetime expected over time for a similar wafer stored at 350° C.

EXAMPLE 2

A silicon wafer was sliced from a single crystal silicon ingot prepared by the Czochralski crystal growing technique in the presence of a transverse magnetic field. The wafer's thickness and diameter were 1400 microns and 150 millimeters, respectively. The average minority carrier recombination lifetime of the wafer was determined by ELYMAT measurement to be about 65 microseconds. The average iron content of the wafer was estimated to be $2.8 \times 10^{11}$ cm$^{-3}$. The wafer was then placed in a quartz boat and stored in a quartz tube furnace at a temperature of 400° C. for 1350 hours in atmosphere of $N_2$. The wafer was allowed to cool and determined by ELYMAT measurement to have an average minority carrier recombination lifetime of about 717 microseconds. The average iron content was estimated to be about $2.5 \times 10^{10}$ cm$^{-3}$. The minority carrier recombination lifetimes of 65 and 717 microseconds before and after storage, respectively, are plotted in FIG. 2. Also plotted in FIG. 2 are minority carrier recombination lifetime values for similar wafers stored for periods between 0 and 1350 hours.

EXAMPLE 3

A silicon wafer was sliced from a single crystal silicon ingot prepared by the Czochralski crystal growing technique in the presence of a transverse magnetic field. The wafer's thickness and diameter were 1400 microns and 150 millimeters, respectively. The average minority carrier recombination lifetime of the wafer was determined by ELYMAT measurement to be about 280 microseconds. The average iron content of the wafer was estimated to be $4.6 \times 10^{10}$ cm$^{-3}$. The wafer was then placed in a quartz boat and stored in a quartz tube furnace at a temperature of 400° C. for 1350 hours in atmosphere of $N_2$. The wafer was allowed to cool and determined by ELYMAT measurement to have an average minority carrier recombination lifetime of about 1111 microseconds. The average iron content was estimated to be about $1.6 \times 10^{10}$ cm$^{-3}$. The minority carrier recombination lifetimes of 280 and 1111 microseconds before and after storage, respectively, are plotted in FIG. 2. Also plotted in FIG. 2 are minority carrier recombination lifetime values for similar wafers stored for periods between 0 and 1350 hours.

EXAMPLE 4

A silicon wafer was sliced from a single crystal silicon ingot prepared by the Czochralski crystal growing technique in the presence of a transverse magnetic field. The wafer's thickness and diameter were 1400 microns and 150 millimeters, respectively. The average minority carrier recombination lifetime of the wafer was determined by ELYMAT measurement to be about 515 microseconds. The average iron content of the wafer was estimated to be $3.5 \times 10^{10}$ cm$^{-3}$. The wafer was then placed in a quartz boat and stored in a quartz tube furnace at a temperature of 400° C. for 1350 hours in atmosphere of $N_2$. The wafer was allowed to cool and determined by ELYMAT measurement to have an average minority carrier recombination lifetime of about 1770 microseconds. The average iron content was estimated to be about $1 \times 10^{10}$ cm$^{-3}$. The minority carrier recombination lifetimes of 515 and 1770 microseconds before and after storage, respectively, are plotted in FIG. 2. Also plotted in FIG. 2 are minority carrier recombination lifetime values for similar wafers stored for periods between 0 and 1350 hours.

This process has been described in connection with single crystal silicon wafers which are the starting material for the manufacture of electronic devices. It is contemplated, however, that the process is equally applicable to the control of contamination in polysilicon bodies, in finished or nearly finished silicon-based electronic devices themselves, and in semiconductor devices which include bodies of silicon. In particular, through the application of the storage times and temperatures described above, a reduction of bulk contamination and improvement of minority carrier diffusion length and minority carrier recombination lifetime in the silicon substrate on which electronic devices are manufactured can be achieved. In certain devices, the surface to which iron is caused to diffuse may be an interface within the device rather than a surface on the exterior of the device. Such processing may, in certain cases, result in a significant improvement of the device performance.

One particular electronic device which could benefit from being processed in accordance with this invention are photovoltaic, or solar, cells. Because the minority carrier diffusion length of the silicon in such devices is a major factor affecting efficiency, they could be significantly improved by this process. At some stage near or at the end of the manufacturing sequence of a photovoltaic cell, preferably after the last thermal treatment above 550° C., the cell would be stored at a temperature and for a time as described above. Advantageously, such temperatures might be achieved by passive solar heating, thus keeping the costs of such storage relatively low. Iron from regions of the wafer bulk at distances from the wafer surface greater than 10% of the wafer thickness, preferably from regions at distances from the wafer surface greater than 30% of the wafer thickness, and most preferably from the entire thickness of the wafer, would thereby be caused to diffuse to the surface. After treatment, however, no etching or polishing of the surfaces to which the iron had diffused would be possible. Iron would remain at the surface of the silicon, or at an interface between the silicon and a surface layer, where it would not significantly reduce the minority carrier diffusion length of the silicon bulk. Furthermore, significant quantities of the diffused iron would not be expected to diffuse back to regions in the silicon where it would be detrimental to minority carrier diffusion length because the cell would not thereafter be subjected to temperatures high enough to cause such diffusion.

It should also be noted that this invention includes increasing the minority carrier recombination lifetime through the control of transition metal contaminants other than iron. Iron contamination is given primary consideration in the foregoing description due to its ubiquitous nature in silicon processing and its prevalence among detriments to minority carrier recombination lifetime. It is within the skill of the art to control other silicon contaminants having known physical properties which render them subject to diffusion under similar conditions as iron, which conditions are not harmful to the silicon or device. Such transition metal contaminants include chromium, cobalt, manganese, zinc and vanadium.

Although specific examples of the present invention and its application are set forth it is not intended that they are exhaustive or limiting of the invention. These illustrations and explanations are intended to acquaint others skilled in the art with the invention, its principles, and its practical application, so that others skilled in the art may adapt and apply the invention in its numerous forms, as may be best suited to the requirements of a particular use.

I claim:

1. A process for increasing the minority carrier recombination lifetime in a silicon body contaminated with a metal selected from the group consisting of iron, chromium, cobalt, manganese, zinc and vanadium, the process comprising storing the silicon body at a storage temperature and for a storage period sufficient to cause the metal to diffuse from the bulk of the silicon body to the surface of the silicon body to measurably increase the minority carrier recombination lifetime of the silicon body, the storage period being at least about 48 hours.

2. The process of claim 1 wherein said metal is iron, the process comprising the additional step of removing diffused iron from said surface.

3. A process for increasing the minority carrier recombination lifetime in a silicon body component of a photovoltaic cell, which silicon body is contaminated with a metal selected from the group consisting of iron, chromium, cobalt, manganese, zinc and vanadium, the process comprising storing the silicon body at a storage temperature and for a period sufficient to cause the metal to diffuse from the bulk of the silicon body to the surface of the silicon body to measurably increase the minority carrier recombination lifetime.

4. A process for reducing the concentration of iron in a silicon body comprising storing the silicon body at a storage temperature and for a period sufficient to cause iron, from regions of the bulk of the silicon body at distances more than 10 microns form the surface of the silicon body, to diffuse to the surface of the silicon body and removing iron from said surface, the storage temperature being greater than about 200° C. and the period being at least about 48 hours.

5. The process of claim 4 wherein the storage temperature is less than about 390° C.

6. The process of claim 5 wherein the storage temperature is between about 300° C. and about 380° C.

7. A process for increasing the minority carrier recombination lifetime of a silicon wafer contaminated with iron comprising storing the wafer at a storage temperature and for a period sufficient to cause iron from regions of the wafer bulk at distances from the wafer surface greater than 10% of the wafer thickness to diffuse to the surface, and removing diffused iron from the surface of the wafer, the storage temperature being insufficient to produce oxygen-related defects in the silicon but at least about 200° C.

8. The process of claim 7 comprising causing iron, from regions of the wafer bulk at distances from the wafer surface greater than 30% of the wafer thickness, to diffuse to the surface of the wafer.

9. The process of claim 7 wherein said storage temperature is between about 250° C. and about 380° C. and said period is at least about 48 hours.

10. The process of claim 7 comprising increasing the minority carrier recombination lifetime by more than about 200 microseconds.

11. The process of claim 7 wherein the wafer is a slice of a single crystal of silicon prepared using the Czochralski technique and having an oxygen content greater than about 10 ppma.

12. The process of claim 7 comprising removing diffused iron from the surface of the wafer by polishing the wafer.

13. The process of claim 7 wherein said storage period is at least about 96 hours.

14. The process of claim 13 wherein said storage period is at least about 168 hours.

15. A process for increasing the minority carrier recombination lifetime of a silicon wafer contaminated with iron comprising storing the wafer at a storage temperature of at least about 225° C. for at least about 48 hours to cause iron from regions of the wafer bulk at distances from the wafer surface greater than 20% of the wafer thickness to diffuse to the surface of the wafer and removing diffused iron from the surface of the wafer.

16. A process for increasing the minority carrier recombination lifetime in a silicon body contaminated with a metal selected from the group consisting of iron, chromium, cobalt, manganese, zinc and vanadium, the process comprising storing the silicon body at a storage temperature between about 200° C. and about 550° C. and for a storage period sufficient to cause the metal to diffuse from the bulk of the silicon body to the surface of the silicon body to measurably increase the minority carrier recombination lifetime of the silicon body, the storage period being at least about 48 hours.

17. The process of claim 16 wherein the process additionally comprises the step of removing the diffused metal from the silicon body surface.

18. The process of claim 16 wherein the storage temperature is between 200° C. and about 390° C. and the process additionally comprises the step of removing the diffused metal from the silicon body surface.

19. The process of claim 16 wherein the metal is selected from the group consisting of chromium, cobalt, manganese, zinc and vanadium.

20. The process of claim 1 wherein the metal is selected from the group consisting of chromium, cobalt, manganese, zinc and vanadium.

21. A process for increasing the minority carrier recombination lifetime in a silicon body having a monocrystalline surface, the silicon body being contaminated with a metal selected from the group consisting of iron, chromium, cobalt, manganese, zinc and vanadium, the process comprising storing the silicon body at a storage temperature and for a storage period sufficient to cause the metal to diffuse from the bulk of the silicon body to the monocrystalline surface of the silicon body to measurably increase the minority carrier recombination lifetime of the silicon body, the storage period being at least about 48 hours.

22. The process of claim 21 wherein the storage temperature is less than about 550° C.

* * * * *

UNITED STATES PATENT AND TRADEMARK OFFICE
CERTIFICATE OF CORRECTION

PATENT NO. : 5,272,119

DATED : December 21, 1993

INVENTOR(S) : Robert Falster

It is certified that error appears in the above-identified patent and that said Letters Patent is hereby corrected as shown below:

Title page, of the patent under the title "(56) U.S. Patent Documents" the following should be included ---4,410,395 10/1983 Weaver et al. 156/662---.

Title page, of the patent under the title of "(30) Foreign Application Priority Data" should read --- 09/26/93 (IT) Italy RM92A000687---.

Column 8, claim 4, line 40, "microns form the" should read ---microns from the---.

Signed and Sealed this

Nineteenth Day of July, 1994

*Attest:*

BRUCE LEHMAN

*Attesting Officer*     *Commissioner of Patents and Trademarks*